United States Patent [19]
Lee

[11] Patent Number: 5,536,948
[45] Date of Patent: Jul. 16, 1996

[54] INFRARED DETECTOR ELEMENT SUBSTRATE WITH SUPERLATTICE LAYERS

[75] Inventor: Myung B. Lee, Smithtown, N.Y.

[73] Assignee: Grumman Aerospace Corporation, Bethpage, N.Y.

[21] Appl. No.: 294,635

[22] Filed: Aug. 23, 1994

[51] Int. Cl.$^6$ .................. H01L 29/06; H01L 31/0328; H01L 31/0336

[52] U.S. Cl. ................... 257/17; 257/18; 257/19; 257/22; 257/201

[58] Field of Search .................. 257/17, 18, 19, 257/22, 201

[56] References Cited

U.S. PATENT DOCUMENTS

| | | | |
|---|---|---|---|
| 4,558,336 | 12/1985 | Chang et al. | 257/18 |
| 4,784,970 | 11/1988 | Solomon | 437/51 |
| 4,794,092 | 12/1988 | Solomon | 437/51 |
| 4,907,128 | 3/1990 | Solomon et al. | 361/412 |
| 4,952,792 | 8/1990 | Caridi | 257/18 |
| 4,963,508 | 10/1990 | Umeno et al. | 437/132 |
| 4,988,641 | 1/1991 | Solomon | 437/83 |
| 4,992,908 | 2/1991 | Solomon | 361/400 |
| 5,013,687 | 5/1991 | Solomon | 437/209 |
| 5,013,919 | 5/1991 | Solomon | 250/349 |
| 5,030,828 | 7/1991 | Solomon | 250/338.4 |
| 5,036,203 | 6/1991 | Solomon | 250/370.06 |
| 5,045,907 | 9/1991 | Solomon | 357/30 |
| 5,053,350 | 10/1991 | Solomon | 437/47 |
| 5,064,771 | 11/1991 | Solomon | 437/3 |
| 5,067,233 | 11/1991 | Solomon | 29/852 |
| 5,075,201 | 12/1991 | Koh | 430/321 |
| 5,075,238 | 12/1991 | Solomon | 437/3 |
| 5,093,708 | 3/1992 | Solomon | 357/68 |
| 5,128,749 | 7/1992 | Hornback et al. | 357/80 |
| 5,135,556 | 8/1992 | Hornback et al. | 65/43 |
| 5,138,164 | 8/1992 | Koh | 250/339 |
| 5,149,671 | 9/1992 | Koh et al. | 437/183 |
| 5,209,798 | 5/1993 | Solomon et al. | 156/153 |
| 5,231,304 | 7/1993 | Solomon | 257/684 |
| 5,315,147 | 5/1994 | Solomon | 257/448 |

OTHER PUBLICATIONS

Kurtz et al, "Demonstration of an InAsSb Strained–Layer Superlattice Photodiode," *Appl. Phys. Lett.* 52(19), 9 May 1988, pp. 1581–1583.

Shinohara, "Dislocation–Free GaAs Epitaxial Growth With the Use of Modulation–Doped AlAs—GaAs Superlattice Buffer Layers," *Appl. Phys. Lett.* 52(7), 15 Feb. 1988, pp. 543–545.

Tischler et al, "Defect Reduction in GaAs Epitaxial Layers Using a GaAs InGaAs Strained–Layer Superlattice," *Appl. Phys. Lett.* 46(3), 1 Feb. 1985, pp. 294–296.

Hansen et al., "Magnetoresistance Measurements of Doping Symmetry and Strain Effects in GaSb–AlSb Quantum Wells," *Appl. Phys. Lett.* 56(1), 1 Jan. 1990, pp. 81–83.

Chen et al, "Two–Mode InGaSb/GaSb Strained–Layer Superlattice Infrared Photodetector," *IEEE Electron Device Letters*, vol. 14, No. 9, Sep. 1993, pp. 447–449.

*Primary Examiner*—William Mintel
*Attorney, Agent, or Firm*—Stetina Brunda & Buyan

[57] ABSTRACT

A substrate upon which infrared elements are formed has a crystalline base layer, preferably comprised of silicon; a first strain superlattice layer formed upon the base layer; and a first matched superlattice layer formed upon the strain superlattice layer. The strain superlattice layer and the matched superlattice layer mitigate defect propagation from the base layer to the infrared detector elements. Optionally, a plurality of additional or second strain and matched superlattice layers are formed in an alternating layer configuration upon the first matched superlattice layer so as to achieve enhanced defect filtering.

13 Claims, 1 Drawing Sheet

INFRARED DETECTOR ELEMENT SUBSTRATE WITH SUPERLATTICE LAYERS

FIELD OF THE INVENTION

The present invention relates generally to infrared detector element fabrication and more particularly to a substrate upon which infrared detector elements are formed. The substrate comprises strain and matched superlattice superlattice layers to mitigate crystal lattice defect propagation from a base layer to infrared detector elements wherein such defects undesirably affect the performance thereof.

BACKGROUND OF THE INVENTION

The infrared spectrum covers a range of wavelengths longer than the visible wavelengths but shorter than microwave wavelengths. Visible wavelengths are generally regarded as between 0.4 and 0.75 micrometers. The near infrared wavelengths extend from 0.75 micrometers to 10 micrometers. The far infrared wavelengths cover the range from approximately 10 micrometers to 1 millimeter. The function of infrared detectors is to respond to energy of a wavelength within some particular portion of the infrared region.

Heated objects dissipate thermal energy having characteristic wavelengths within the infrared spectrum. Different levels of thermal energy, corresponding to different sources of heat, are characterized by the emission of signals within different portions of the infrared frequency spectrum. No single detector is uniformly efficient over the entire infrared frequency spectrum. Thus, detectors are selected in accordance with their sensitivity in the range of interest to the designer. Similarly, electronic circuitry that receives and processes the signals from the infrared detector must also be selected in view of the intended detection function.

A variety of different types of infrared detectors have been proposed in the art since the first crude infrared detector was constructed in the early 1800's. Virtually all contemporary infrared detectors are solid state devices constructed of materials that respond to infrared frequency energy in one of several ways. Thermal detectors respond to infrared frequency energy by absorbing that energy causing an increase in temperature of the detecting material. The increased temperature in turn causes some other property of the material, such as resistivity, to change. By measuring this change the infrared radiation is measured.

Photo-type detectors (e.g., photoconductive and photovoltaic detectors) absorb the infrared frequency energy directly into the electronic structure of the material, inducing an electronic transition which, in turn, leads to either a change in the electrical conductivity (photoconductors) or to the generation of an output voltage across the terminals of the detector (photovoltaic detectors). The precise change that is effected is a function of various factors including the particular detector material selected, the doping density of that material and the detector area.

By the late 1800's, infrared detectors had been developed that could detect the heat from an animal at one quarter of a mile. The introduction of focusing lenses constructed of materials transparent to infrared frequency energy, as well as advances in semiconductor materials and highly sensitive electronic circuity have advanced the performance of contemporary infrared detectors close to the ideal photon limit.

Current infrared detection systems incorporate arrays of large numbers of discrete, highly sensitive detector elements the outputs of which are connected to sophisticated processing circuitry. By rapidly analyzing the pattern and sequence of detector element excitations, the processing circuitry can identify and monitor sources of infrared radiation. Though the theoretical performance of such systems is satisfactory for many applications, it is difficult to actually construct structures that mate a million or more detector elements and associated circuitry in a reliable and practical manner. Consequently, practical applications for contemporary infrared detection systems have necessitated that further advances be made in areas such as miniaturization of the detector array and accompanying circuitry, minimization of noise intermixed with the electrical signal generated by the detector elements, and improvements in the reliability and standardized economical production of the detector array and accompanying circuitry.

Silicon is the substrate of choice for the fabrication of InAsSb infrared detectors because it facilitates the use of mature silicon-based device fabrication technology and also affords monolithic integration. However, contemporary InAsSb detectors formed upon silicon substrates exhibit poor detection performance, primarily due to a large number of defects which propagate from the silicon substrate into the InAsSb detector formed thereupon.

As those skilled in the art are aware, various different types of defects are known to exist within crystal structures, such as silicon substrates upon which infrared detector elements are formed. The different types of defects include point defects, line defects, and plane defects.

A point defect may be caused by a missing or extra atom within the crystal lattice. At the point where the missing or extra atom is located, the continuity of the crystal lattice is disrupted.

A line defect exists where a row of adjacent atoms in the crystal lattice is not bonded properly to an adjacent row of atoms. For example, one row may be shifted relative to the other such that each atom in a row bonds to an atom which is immediately adjacent the atom to which it would be bonded if no such defect existed.

A plane defect exists where two planar surfaces of crystalline material bond to one another in a manner which is not consistent with the adjacent crystalline structure. For example, each of the atoms of one planar surface may be shifted by the distance of approximately one atom spacing such that the atoms of one planar surface bond to atoms immediately adjacent to those to which they would normally be bonded, if no such defect existed, in a manner similar to that which occurs in a line defect. Thus, a plane defect is essentially a two dimensional line defect.

It is well known that crystal lattice defects propagate from one position to another within a crystal lattice over time. Such defect propagation may best be understood by way of an example utilizing a point defect. If one considers a point defect wherein an atom is missing from the crystal lattice structure, it is easy to understand that a hole effectively results at the site of the missing atom. Any of the atoms of the crystal lattice structure adjacent the hole may, over time, move so as to fill in the hole, thus leaving behind another hole where that atom had previously been located. The effect is the same as if the hole itself had moved. Thus, in this manner, the defect may tend to propagate to different locations throughout the crystal.

The silicon substrate upon which infrared detectors are formed is typically comprised of polycrystalline material wherein various regions of the substrate contain crystal lattices of different orientations which meet and interface with one another. At these interfaces the probability of a crystal lattice defect occurring is substantially increased. That is, when two crystalline regions of different orientations intersect, it is likely that a crystal lattice defect will occur at this location.

As such, the crystal lattice defect density within the silicon substrate is considerably greater than that of the single crystalline infrared detector elements. Thus, when single crystalline infrared detector elements are formed upon a polycrystalline substrate, it is likely that, over time, there will be greater propagation of crystalline defects from the substrate to the infrared detector elements than vice-versa. Since the performance of the infrared detector elements depends substantially upon the density of crystal lattice defects occurring therein, it is desirable to mitigate crystal lattice defect propagation from the substrate to the infrared detector elements.

It is not possible to isolate the detector elements from the substrate with many of the materials used in contemporary integrated circuit or detector fabrication, since it is necessary that any material to be disposed intermediate the detector elements and the substrate be compatible with the crystal structure of both the infrared detector elements and the substrate so as to afford monolithic construction. Thus, it is not feasible to utilize materials which substantially disrupt the crystal lattice structure of the infrared detector elements and the substrate. For example, it is not feasible to utilize vacuum deposited aluminum as a defect filter, since such a layer of aluminum, deposited upon a silicon substrate, would not provide the necessary crystal structure to seed subsequently deposited infrared detector element material.

As such, it is beneficial to provide a means for mitigating crystal lattice defect propagation from the silicon substrate or base layer upon which the infrared detector elements are formed into the InAsSb detector elements themselves.

SUMMARY OF THE INVENTION

The present invention specifically addresses and alleviates the above-mentioned deficiencies associated with the prior art. More particularly, the present invention comprises a substrate upon which infrared elements are formed. The substrate comprises a crystalline base layer, preferably comprised of silicon; a first strain superlattice layer formed upon the base layer; and a first matched superlattice layer formed upon the strain superlattice layer. The strain superlattice layer and the matched superlattice layer prevent defects in the substrate from propagating to the infrared detector elements as discussed in detail below. Optionally, additional strain and matched superlattice layers may be formed in an alternating layer configuration upon the first matched superlattice layer so as to achieve enhanced defect filtering.

The strain and matched superlattice layers define a defect filter which tends to mitigate defect propagation from the substrate to detector elements formed thereon. Each strain superlattice layer preferably comprises a series of alternating sublayers of gallium antimonide and indium arsenic antimonide and each matched superlattice layer preferably comprises alternating sublayers of gallium antimonide and aluminum antimonide. It has been found that such a defect filter substantially reduces the density of defects propagating from the substrate to the detector elements.

As used herein, "matched" layers refer to a pair of sublayers having the same lattice constant, i.e., atom spacing, and "strain sublayers" refer to layers having differing lattice constants. A "superlattice" is defined as a series of two or more alternating sublayers of different materials and may define either matched or strain layers.

Each superlattice layer of the present invention preferably comprises 10–15 pairs of two thin sublayers of semiconductor alloys (gallium antimonide and aluminum antimonide for the matched superlattice sublayers and gallium antimonide and indium arsenic antimonide for the strain superlattice sublayers). The thickness of each layer comprising one of the superlattice layers is preferably between approximately 10–500 angstroms thick, preferably approximately 50 angstroms thick.

The strain and matched superlattice layers are preferably approximately 1,000 angstroms thick. The InAsSb detector elements are preferably approximately 5 microns thick. The strain superlattice layer bends defects away from the infrared detector elements via the strain field created by the differences in elasticity between the two sublayers comprising the strain superlattice layer. Similarly, the matched superlattice layer deflects defects away from the infrared detector elements via an image forced generated by differences in the elasticity of the two sublayers thereof. Thus, the defect filter utilizes two distinct filtering mechanisms to mitigate defect propagation from the substrate to infrared detector elements formed thereon.

More particularly, the strain and matched superlattice layers are believed to mitigate defect propagation by turning those defects propagating in a direction normal to the plane of the substrate toward a direction generally parallel with the plane of the substrate such that the defects do not propagate from the substrate to the infrared detector elements formed thereon, but rather tend to propagate along the surface of the substrate.

Since the performance of InAsSb infrared detector elements is known to be inversely proportional to the density of defects contained therein, it is expected that detector sensitivity will be significantly improved by use of the improved substrate having a defect filter of the present invention.

The defect filter of the present invention may additionally be utilized, with appropriate modification, to improve the performance of a wide range of different electro-optical devices whose performance characteristics are affected by the quality of the crystal material from which they are formed. These devices include, but are not limited to, optical detectors, optical modulators, semiconductor lasers.

Thus, the method for forming an infrared detector assembly according to the present invention comprises the steps of forming a strain superlattice layer upon a crystalline substrate or base layer, preferably a silicon substrate, forming a matched superlattice layer upon the strain superlattice layer, and forming at least one infrared detector element upon the matched superlattice layer. Those skilled in the art will recognize that different numbers of strain and matched superlattice layers may be utilized, as desired.

The strain and matched superlattice layers formed upon the silicon substrate thus mitigate the propagation of crystal lattice defects from the substrate to infrared detector elements formed thereon. This reduces the density of crystal lattice defects within the InAsSb detector elements, consequentially, substantially increasing the performance thereof.

These, as well as other advantages of the present invention will be more apparent from the following description and drawings. It is understood that changes in the specific structure shown and described may be made within the scope of the claims without departing from the spirit of the invention.

DETAILED DESCRIPTION OF THE PREFERRED EMBODIMENT

The detailed description set forth below in connection with the appended drawings is intended as a description of the presently preferred embodiments of the invention, and is not intended to represent the only forms in which the present invention may be constructed or utilized. The description sets forth the functions and sequence of steps for constructing and operating the invention in connection with the illustrated embodiments. It is to be understood, however, that the same or equivalent functions and sequences may be accomplished by different embodiments that are also intended to be encompassed within the spirit and scope of the invention.

Figure 1:
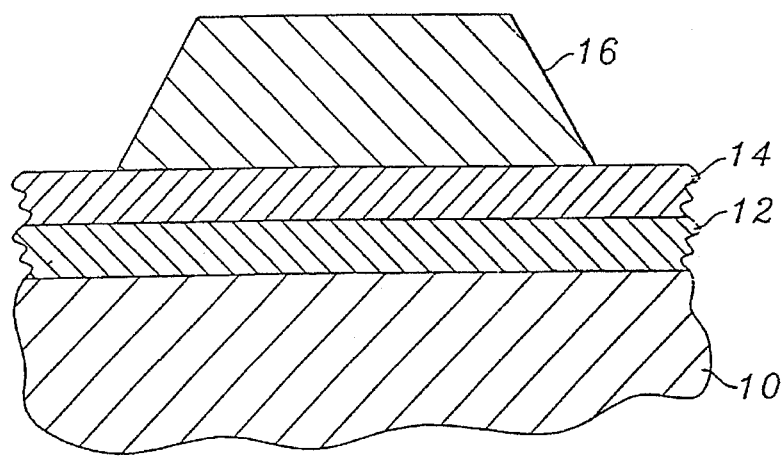
FIG. 1 is a fragmentary cross-sectional side view of a first embodiment of an infrared detector assembly having one strain superlattice layer and one matched superlattice layer formed intermediate the substrate and an infrared detector element according to the present invention.
Figure 2:
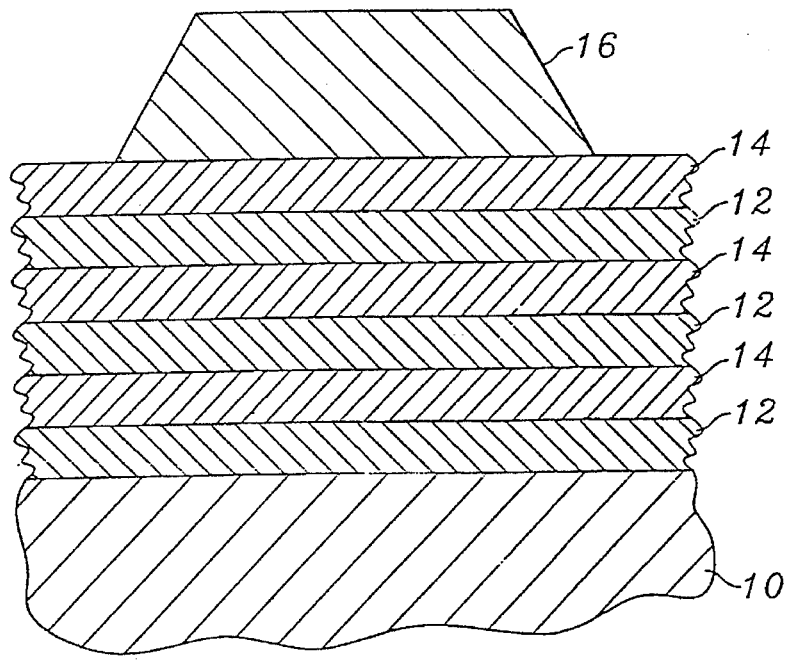
FIG. 2 is a fragmentary cross-sectional side view of a second embodiment of an infrared detector assembly having a plurality of strain superlattice layers and a corresponding plurality of matched superlattice layers formed in an alternating fashion intermediate the substrate and an infrared detector element according to the present invention.

The infrared detector assembly of the present invention is illustrated in FIGS. 1 and 2, which depict two presently preferred embodiments of the invention. Referring now to FIG. 1, a first embodiment of the present invention generally comprises a substrate or base 10 upon which is formed a first strain superlattice layer 12 and upon which in turn is formed a matched superlattice layer 14. One or more infrared detector elements 16 are then formed upon the matched superlattice layer 14.

Each strain layer preferably comprises 10–15 pairs of gallium antimonide superlattice sublayers in an alternating configuration with indium arsenic antimonide superlattice sublayers. Similarly, each matched superlattice layer preferably comprises 10–15 pairs of gallium antimonide sublayers in an alternating configuration with aluminum antimonide layers. Those skilled in the art will recognize that various different numbers of pairs of strain and matched superlattice layers may be utilized, as desired. Each of the gallium antimonide, indium arsenic antimonide, and aluminum antimonide layers is preferably approximately 10–500 angstrom thick, preferably approximately 50 angstrom thick.

Referring now to FIG. 2, a second embodiment of the present invention comprises a plurality of strain superlattice layers 12 and matched superlattice layers 14 formed in an alternating layer configuration intermediate the base 10 and the infrared detector element 16. The number of alternating strain 12 and matched 14 layers may be varied, as desired.

Thus, in both the first and second embodiments of the present invention, the base 10 preferably comprises silicon, and the strain 12 and matched 14 layers preferably comprise a superlattice material, preferably a semiconductor alloy.

Thus, a defect filter, comprised of two different types of superlattice layers, is disposed intermediate the base 10 and the detector elements 16 so as to mitigate the propagation of defects from the crystalline base layer 10 to the individual infrared detector elements 16, thereby reducing their performance.

The strain superlattice layers 12 bend defects away from the InAsSb infrared detector element 16 with their strain fields and the matched superlattice layers 14 deflect defects away from the InAsSb infrared detector element 16 with the image force generated by differences in elasticity constants of the constituent layers thereof as discussed above. The resultant reduction in defect density within the InAsSb infrared detector element 16 provides superior performance enhancement as compared to contemporary InAsSb infrared detector elements formed upon a silicon substrate.

In the second embodiment of the present invention, 10 pairs of alternating strain 12 and matched 14 layers are utilized (three pairs are illustrated in FIG. 2 for simplicity). In the preferred embodiment of the present invention the strain superlattice layer is formed directly upon the substrate and the matched superlattice layer is formed upon the strain superlattice layer. Those skilled in the art will appreciate that the position of these two layers may be reversed, i.e., the matched superlattice layer formed directly upon the substrate and the strain superlattice layer formed upon the matched superlattice layer. Each strain 12 and matched 14 layer is preferably 10 to 1,000 angstroms thick. The InAsSb infrared detector element preferably comprises a PN junction about 5 microns thick, formed upon the upper-most matched 14 layer.

It is understood that the exemplary infrared detector element substrate described herein and shown in the drawings represents only a presently preferred embodiment of the invention. Indeed, various modifications and additions may be made to such embodiment without departing from the spirit and scope of the invention. For example, various crystalline substrates other than silicon are contemplated. Additionally, various materials other than gallium antimonide and indium arsenic antimonide may be utilized in the formation of strain superlattice layers and various materials other than gallium antimonide and aluminum antimonide may be utilized in the formation of matched superlattice layers. The defect filter of the present invention may be utilized in various applications wherein it is desirable to isolate the electro-optical active components of an imaging system from a crystalline substrate. As such, the defect filters of the present invention may find application in such other diverse applications as optical modulators and semiconductor lasers. Thus, these and other modifications and additions may be obvious to those skilled in the art and may be implemented to adapt the present invention for use in a variety of different applications.

What is claimed is:

1. A substrate upon which infrared detector elements are formed, the substrate comprising:

a) a crystalline base layer;

b) a first strain superlattice layer formed of a plurality of pairs of gallium antimonide and indium arsenic antimonide sublayers configured in an alternating arrangement;

c) a first matched superlattice layer formed of a plurality of pairs of gallium antimonide and aluminum antimonide sublayers configured in an alternating arrangement, wherein said first strain and matched superlattice layers are formed, one atop the other, upon the base layer; and d) a plurality of second strain and matched superlattice layers formed in an alternating layer configuration upon said first strain and matched superlattice layers;

e) wherein said strain superlattice layers and said matched superlattice layers mitigate defect propagation from said base layer to the infrared detector elements.

2. The substrate as recited in claim 1 wherein said base layer comprises silicon, 3. The substrate as recited in claim 1 wherein said first strain and matched superlattice layers comprise a plurality of sublayers such that each of said first strain and matched superlattice layers are approximately 1,000 angstroms thick.

4. The substrate as recited in claim 1 wherein said first strain and matched superlattice layers comprise sublayers formed of semiconductor alloys.

5. The substrate as recited in claim 1 wherein:
   a) said first strain superlattice layer comprises between approximately 10 and 15 pairs of gallium antimonide and indium arsenic antimonide sublayers; and
   b) said first matched layer comprises between approximately 10 and 15 pairs of gallium antimonide and aluminum antimonide sublayers.

6. The substrate as recited in claim 1 wherein said first strain superlattice layer is formed upon said base layer and said first matched superlattice layer is formed upon said strain superlattice layer.

7. An infrared detector assembly comprising:
   a) a crystalline base layer;
   b) a first strain superlattice layer, said first strain superlattice layer being formed of a plurality of pairs of gallium antimonide and indium arsenic antimonide sublayers configured in an alternating arrangement;
   c) a first matched superlattice layer said first matched superlattice layer being formed of a plurality of pairs of gallium antimonide and aluminum antimonide sublayers configured in an alternating arrangement, wherein said first strain and matched superlattice layers are formed, one atop the other, upon the base layer;
   d) a plurality of second strain and matched superlattice layers formed in an alternating layer configuration upon said first strain and matched superlattice layers; and
   e) at least one infrared detector element formed upon one of said first strain and matched superlattice layers;
   f) wherein said strain superlattice layers and said matched superlattice layers mitigate defect propagation from said base layer to the infrared detector elements.

8. The infrared detector assembly as recited in claim 7 wherein said base layer comprises silicon.

9. The infrared detector assembly as recited in claim 7 wherein said first strain and matched superlattice layers each comprise a plurality of sublayers such that each of said first strain and matched superlattice layers are approximately 1,000 angstroms thick.

10. The infrared detector assembly as recited in claim 7 wherein said second strain and matched superlattice layers comprise semiconductor alloys.

11. The infrared detector assembly as recited in claim 7 wherein:
    a) said first strain superlattice layer comprises between approximately 10 and 15 pairs of gallium antimonide and indium arsenic antimonide sublayers; and
    b) said first matched superlattice layer comprises between approximately 10 and 15 pairs of gallium antimonide and aluminum antimonide sublayers.

12. The infrared detector assembly as recited in claim 7 wherein said first strain superlattice layer is formed upon said base layer and said first matched superlattice layer is formed upon said first strain superlattice layer.

13. A substrate upon which infrared detector elements are formed, the substrate comprising:
    a) a crystalline base layer; and
    b) a plurality of strain and matched superlattice layers formed in an alternating layer configuration upon said crystalline base layer;
    c) wherein said strain superlattice layers comprise a plurality of pairs of gallium antimonide and indium arsenic antimonide sublayers configured in an alternating layer arrangement;
    d) wherein said matched superlattice layers comprise a plurality of pairs of gallium antimonide and aluminum antimonide sublayers configured in an alternating arrangement;
    e) wherein said strain superlattice layers and said matched superlattice layers mitigate defect propagation from said base layer to the infrared detector elements.

* * * * *